US012149210B2

(12) United States Patent
Fard et al.

(10) Patent No.: US 12,149,210 B2
(45) Date of Patent: Nov. 19, 2024

(54) AMPLIFIER LINEARIZATION USING MAGNETICALLY COUPLED FEEDBACK

(71) Applicant: QuantalRF AG, Zurich (CH)

(72) Inventors: Ali Fard, Corona Del Mar, CA (US); Mats Carlsson, Sundbyberg (SE)

(73) Assignee: QuantalRF AG (CH)

( * ) Notice: Subject to any disclaimer, the term of this patent is extended or adjusted under 35 U.S.C. 154(b) by 286 days.

(21) Appl. No.: 17/486,339

(22) Filed: Sep. 27, 2021

(65) Prior Publication Data

US 2022/0103132 A1 Mar. 31, 2022

Related U.S. Application Data

(60) Provisional application No. 63/084,497, filed on Sep. 28, 2020.

(51) Int. Cl.
*H03F 3/26* (2006.01)
*H01F 38/14* (2006.01)
(Continued)

(52) U.S. Cl.
CPC ............... *H03F 1/32* (2013.01); *H01F 38/14* (2013.01); *H03F 1/3229* (2013.01);
(Continued)

(58) Field of Classification Search
CPC ........ H03F 1/32; H03F 1/3229; H03F 1/3247; H03F 1/347; H03F 3/21; H03F 3/24;
(Continued)

(56) References Cited

U.S. PATENT DOCUMENTS 5,434,538 A 7/1995 Lee et al.
5,877,654 A 3/1999 Fong et al.
(Continued)

FOREIGN PATENT DOCUMENTS

CN 104682910 A 6/2015
EP 2685630 A1 1/2014
(Continued)

OTHER PUBLICATIONS

Hsiao, et al., "CMOS Distributed Amplifiers Using Gate-Drain Transformer Feedback Technique," IEEE Transactions on Microwave Theory and Techniques, Aug. 2013, pp. 2901-2910.
(Continued)

*Primary Examiner* — Andrea Lindgren Baltzell
*Assistant Examiner* — Khiem D Nguyen
(74) *Attorney, Agent, or Firm* — Cooley LLP

(57) ABSTRACT

An amplifier circuit includes an amplifier having an amplifier input and an amplifier output. A transformer disposed to provide a signal for driving a load includes a primary winding in series with the amplifier output. A secondary winding of the transformer is coupled to the amplifier input where the primary winding and the secondary winding are arranged such that a portion of a magnetic field generated by the primary winding couples to the secondary winding so as to establish a magnetically coupled feedback loop from the amplifier output to the amplifier input. A loop gain of the magnetically coupled feedback loop is substantially independent of an impedance of the load and is defined at least in part by a coupling factor and turn-ratio of the transformer. The load may be included within an output load arrangement including a balun.

24 Claims, 12 Drawing Sheets

(51) Int. Cl.
    *H03F 1/16*           (2006.01)
    *H03F 1/32*           (2006.01)
    *H03F 1/34*           (2006.01)
    *H03F 3/21*           (2006.01)
    *H03F 3/24*           (2006.01)

(52) U.S. Cl.
    CPC .......... *H03F 1/3247* (2013.01); *H03F 1/347* (2013.01); *H03F 3/21* (2013.01); *H03F 3/24* (2013.01); *H03F 2200/09* (2013.01); *H03F 2200/451* (2013.01); *H03F 2200/534* (2013.01); *H03F 2200/541* (2013.01)

(58) Field of Classification Search
    CPC .......... H03F 2200/09; H03F 2200/451; H03F 2200/534; H03F 2200/541; H03F 2200/228; H03F 1/0266; H03F 2203/45316; H03F 2203/45652; H03F 2203/45662; H03F 2203/45731; H03F 3/195; H03F 3/213; H03F 3/45183; H03F 3/45188; H03F 1/223; H01F 38/14
    USPC ............................................... 330/291, 301
    See application file for complete search history.

(56) References Cited

U.S. PATENT DOCUMENTS

| | | |
|---|---|---|
| 6,236,274 B1 | 5/2001 | Liu |
| 7,339,436 B2 | 3/2008 | Fu et al. |
| 7,486,137 B2 | 2/2009 | Magoon et al. |
| 7,764,125 B2 | 7/2010 | Dawe |
| 7,786,807 B1 | 8/2010 | Li et al. |
| 8,102,213 B2 | 1/2012 | Tasic et al. |
| 8,306,494 B2 | 11/2012 | Ojo |
| 8,446,217 B2 | 5/2013 | Bagga |
| 9,941,949 B2 | 4/2018 | Kessel |
| 10,763,228 B2 | 9/2020 | Seebacher et al. |
| 11,205,998 B2 | 12/2021 | Kong et al. |
| 11,206,006 B2 | 12/2021 | Bagga |
| 2005/0001680 A1 | 1/2005 | Ratzel |
| 2007/0285162 A1 | 12/2007 | Vitzilaios et al. |
| 2009/0245541 A1 | 10/2009 | Wang |
| 2009/0251217 A1 | 10/2009 | Keerti |
| 2011/0148527 A1 | 6/2011 | Bagga |
| 2013/0241672 A1 | 9/2013 | Tamaru et al. |
| 2013/0250536 A1 | 9/2013 | Satake |
| 2014/0184334 A1 | 7/2014 | Nobbe et al. |
| 2014/0191800 A1 | 7/2014 | Jordan |
| 2014/0204806 A1 | 7/2014 | Chuang et al. |
| 2016/0079930 A1 | 3/2016 | Jin |
| 2016/0336983 A1 | 11/2016 | Wang et al. |
| 2018/0062682 A1 | 3/2018 | Wloczysiak et al. |
| 2018/0167038 A1 | 6/2018 | Lee et al. |
| 2020/0186177 A1 | 6/2020 | Gorbachov |
| 2021/0250111 A1 | 8/2021 | Mori |
| 2022/0102070 A1 | 3/2022 | Fard et al. |
| 2022/0103131 A1 | 3/2022 | Fard et al. |
| 2022/0103133 A1 | 3/2022 | Fard et al. |
| 2022/0103134 A1 | 3/2022 | Fard et al. |
| 2022/0190796 A1 | 6/2022 | Carlsson |
| 2022/0337205 A1 | 10/2022 | Fard et al. |
| 2022/0385238 A1 | 12/2022 | Fard et al. |
| 2024/0072766 A1 | 2/2024 | Fard et al. |
| 2024/0080007 A1 | 3/2024 | Fard et al. |
| 2024/0080017 A1 | 3/2024 | Fard et al. |

FOREIGN PATENT DOCUMENTS

| | | |
|---|---|---|
| JP | S6355805 B2 | 11/1988 |
| JP | 2003273664 A | 9/2003 |
| JP | 2006269653 A | 10/2006 |
| JP | 2011517232 A | 5/2011 |
| JP | 2018098565 A | 6/2018 |
| WO | WO-2010007177 A1 | 1/2010 |
| WO | WO-2020201298 A1 | 10/2020 |
| WO | WO 2022/067202 A1 | 3/2022 |
| WO | WO-2022067201 A1 | 3/2022 |
| WO | WO-2022067203 A1 | 3/2022 |
| WO | WO-2022067205 A1 | 3/2022 |
| WO | WO-2022067208 A1 | 3/2022 |
| WO | WO-2023073197 A1 | 5/2023 |
| WO | WO-2023073199 A1 | 5/2023 |
| WO | WO-2024050443 A1 | 3/2024 |

OTHER PUBLICATIONS

Shailesh., et al., "A State-of-the Art Review on Distributed Amplifiers," Wireless Personal Communications, Nov. 2020, pp. 1471-1525. Retrieved from: URL: http://link.springer.com/article/10.1007/s11277-020-07932-9/fulltext.html.

The International Bureau of WIPO, International Preliminary Report on Patentability for International Application No. PCT/US2021/052245, Apr. 4, 2023, 8 pages.

The International Bureau of WIPO, International Preliminary Report on Patentability for International Application No. PCT/US2022/015863, Apr. 13, 2023, 7 pages.

The International Bureau of WIPO, International Preliminary Report on Patentability for International Application No. PCT/US21/52237, Aug. 9, 2023, 6 pages.

The International Bureau of WIPO, International Preliminary Report on Patentability for PCT/US2021/052242, Mar. 28, 2023, 9 pages.

United States Patent and Trademark Office, International Preliminary Report on Patentability for PCT/US2021/052236, Dec. 9, 2022, 22 pages.

International Search Report and Written Opinion for International Application No. PCT/US2022/015863 dated May 12, 2022, 18 pages.

International Preliminary Report on Patentability for International Application No. PCT/US2021/052237, dated Aug. 9, 2023, 6 pages.

European Patent Office, International Search Report and Written Opinion for Application No. PCT/US2021/052239 dated Jan. 4, 2022, 18 pages.

European Patent Office, International Search Report and Written Opinion for International Application No. PCT/US2021/052236 dated Jan. 7, 2022, 18 pages.

European Patent Office, International Search Report and Written Opinion for PCT/EP2020/059151, Oct. 7, 2020, 13 pages.

European Patent Office, International Search Report and Written Opinion issued in Application No. PCT/US2021/052245, dated Jan. 20, 2022, 18 pages.

Gefers, et al., A 1.2V, 200 W rail-to-rail Op Amp with 90dB THD using replica gain enhancement, Solid-State Circuits Conference, Sep. 24-26, 2002, pp. 175-178.

International Search Report and Written Opinion for International Application No. PCT/US2021/052237 dated Jan. 7, 2022, 18 pages.

International Search Report and Written Opinion for International Application No. PCT/US2021/052242 dated Jan. 5, 2022, 18 pages.

Jeon, J.Y., et al., "A Transformer Feedback Wideband CMOS LNA for UWB Application," Asia-Pacific Microwave Conference (APMC), IEEE, Dec. 6, 2015, pp. 1-3, XP032868352.

Liscidini A., et al., "Common Gate Transformer Feedback LNA in a High IIP3 Current Mode RF CMOS Front-End," IEEE Custom Integrated Circuits Conference (CICC), Sep. 10, 2006, pp. 25-28, XP031052414.

Ock et al: "A Cartesian Feedback Feedforward Transmitter", Circuits and Systems (ISCAS), 2011 IEEE International Symposium on, IEEE, May 15, 2011 (May 15, 2011), pp. 209-212, XP031997607, DOI: 10.1109/ISCAS.2011.5937538 ISBN: 978-1-4244-9473-6.

Reiha, M.T., et al., "A 1.2 V Reactive-Feedback 3.1-10.6 GHz Low-Noise Amplifier in 0.13 µm CMOS," IEEE Journal of Solid-State Circuits, May 2007, vol. 42(5), pp. 1023-1033, XP011179497.

Stochino G: "Audio Design Leaps Forward?", Electronics World, Nexus Media Communications, Swanley, Kent, GB, val. 100, No. 1703, Oct. 1, 1994 (Oct. 1, 1994 ), pp. 818-820, 822, XP000474881, ISSN: 0959-8332.

Wang, Y., et al., "A 69.5-79 GHz Low Noise Amplifier in 65-nm CMOS Employing Transformer Feedback Technique," 14th IEEE

(56) References Cited

OTHER PUBLICATIONS

International Conference on Solid-State and Integrated Circuit Technology (ICSICT), 2018, 3 pages.

Wu, L., et al., "Design and Analysis of CMOS LNAs with Transformer Feedback for Wideband Input Matching and Noise Cancellation," IEEE Transactions on Circuits and Systems—I: Regular Papers, Jun. 2017, vol. 64(6), pp. 1626-1635, XP011651012.

Zhang et al: "Linearization Techniques for CMOS Low Noise Amplifiers: A Tutorial", IEEE Transactions on Circuits and Systems 1: Regular Papers, IEEE, US, vol. 58, No. 1, Jan. 1, 2011 (Jan. 1, 2011 ), pp. 22-36, XP011340986, ISSN: 1549-8328, DOI: 10.11 09/TCSI.201 0.2055353.

Huang et al., Quasi-lumped Bandpass Filter With Sharp Transition Edge and Wide Stopband Rejection, Electronic Letters, Mar. 2013, pp. 479-480.

International Search Report and Written Opinion for International Application No. PCT/US2023/073197, mailed on Jan. 23, 2024, 16 pages.

International Search Report and Written Opinion for International Application No. PCT/US2023/073198 dated Jan. 8, 2024, 14 pages.

International Search Report and Written Opinion for PCT Application No. PCT/US2023/073199 dated Jan. 23, 2024, 10 pages.

1

AMPLIFIER LINEARIZATION USING MAGNETICALLY COUPLED FEEDBACK

CROSS REFERENCE TO RELATED APPLICATIONS

This application claims priority to and the benefit of U.S. Provisional Patent Application No. 63/084,497, entitled AMPLIFIER LINEARIZATION USING MAGNETICALLY COUPLED FEEDBACK, filed on Sep. 28, 2020, the disclosure of which is incorporated herein by reference in its entirety for all purposes. This application is related to U.S. patent application Ser. No. 17/486,297, entitled AMPLIFIER LINEARIZATION USING MAGNETICALLY COUPLED FEEDBACK PROVIDED BY A TRANSFORMER COUPLED TO A BALUN-BASED LOAD, filed on even date herewith, to U.S. patent application Ser. No. 17/486,367, entitled DIFFERENTIAL AMPLIFIER INCLUDING DUAL MAGNETICALLY COUPLED FEEDBACK LOOPS, filed on even date herewith, to U.S. patent application Ser. No. 17/486,386, entitled AMPLIFIER INCLUDING MAGNETICALLY COUPLED FEEDBACK LOOP AND STACKED INPUT AND OUTPUT STAGES ADAPTED FOR DC CURRENT REUSE, filed on even date herewith, and to U.S. patent application Ser. No. 17/486,417, entitled METHOD OF IMPROVING LINEARITY OF AMPLIFIER CIRCUIT INCLUDING MAGNETICALLY COUPLED FEEDBACK LOOP BY INCREASING DC BIAS CURRENT WITHOUT IMPACTING AMPLIFIER GAIN, filed on even date herewith, the disclosure of each of which is incorporated herein by reference in its entirety for all purposes.

FIELD

The present disclosure generally relates to linearization of an amplifier and, more particularly but not exclusively, to linearization of power amplifiers operating at radio frequencies.

BACKGROUND

It is well known that the output signal from a power amplifier (PA) can be linearized by various techniques, such as pre-distortion, feed-forward error correction and feedback. These techniques are well described in both textbooks as well as in various scientific and white papers. However, there are drawbacks associated with each of these techniques.

Pre-distortion can be implemented either as analog or digital pre-distortion. Both pre-distortion modes function by characterizing the behavior of the PA and compensating for its response by deliberately distorting the signal driving the PA. If the applied distortion on the input signal is carefully selected, the output signal from the PA could become more linear.

One disadvantage of the analog form of pre-distortion is that it is difficult to find an analog function that counteracts the behavior of the PA. In the digital case, the distortion components tend to impose increased requirements on the digital-to-analog converter (e.g. on bandwidth). Moreover, use of pre-distortion techniques often requires initial calibration or training. In addition, pre-distortion systems are often sensitive to drift, e.g. in temperature.

Reference is now made to FIG. 1, which is a block diagram of an exemplary feed-forward error correction system 10 which may be used to linearize a PA 12. In this system, the distortion generated in the PA 12 is subtracted from the output signal assuming that the two delay circuits 14, 16 match and that the two amplifiers 17, 18 are perfectly linear. However, the system 10 is also susceptible to drift, and it is furthermore difficult to implement delay lines with low loss.

FIG. 2 is block diagram of a so-called Cartesian feedback system 20 for amplifier linearization. In the Cartesian feedback system 20, the response from the PA 22 is down-converted 23 and compared 24 with the base-band IQ signals 25, 26. This approach eliminates issues with drift and detailed characterization of the transfer function of the PA 22. One disadvantage of the Cartesian feedback system 20 is stability and the limited bandwidth it can handle and still maintain stable operation. Cartesian feedback is therefore not suitable for systems where the signal bandwidth is increased to hundreds of MHz (e.g. 802.11ac where the largest bandwidth is 160 MHz). Cartesian feedback also adds circuit complexity and power dissipation.

Turning now to FIG. 3, there is shown a linear feedback system 30 for amplifier linearization. In the linear feedback system 30, a feedback network 32 is connected between the output of a PA 34 and its input. This method gives superior performance but is very difficult to get stable for all different load conditions, especially for larger signal bandwidths.

Despite these known linearization techniques, power amplifiers are commonly implemented without feedback, where the linearity performance instead rely on the inherent linearity of the devices in the selected technology. FIG. 4 illustrates a typical CMOS based PA implementation 40, which consists of a Common Source (CS) stage (M1) followed by a Common Gate (CG) stage (M2). The combination of a CS-stage and a CG-stage in this way is referred to as a Cascode. The linearity of a Cascode is mostly dependent on the CS-stage, which typically consists of a device with short length and lower break-down voltage for increased gain. The CG-stage has often higher break-down voltage to allow for a large PA supply voltage.

The CS-stage converts the input voltage into a current flowing out of the drain of the device M1 and the gain is dependent of the transconductance in M1. The signal transfer can be expressed by the equation $i_{dM1}=-v_{in}g_{m1}$, where $g_{m1}$ is the transconductance of M1 and $v_{in}$ is the input voltage. The device M2 act as a current buffer and will feed the current from M1 to the load impedance $R_L$ if the load inductance $L_d$ resonates at the frequency of operation with the parasitic capacitances at the drain of M2. The output voltage can therefore be expressed as: $v_o=-v_{in}g_{m1}R_L$. From this equation it can be understood that the device M1 must have a transconductance which is not dependent on the signal level, since this would result in a time invariant gain which results in distortion. If the signal is backed off sufficiently, the linearity requirements can be fulfilled, but this approach will impact the efficiency of the PA. In addition, when very good linearity is required, the device M2 will also contribute to signal distortion.

Referring now to FIGS. 5A and 5B, there are illustrated generic voltage amplifier circuit implementations 50, 60 of the direct negative feedback approach to linearization shown in FIG. 3. Although such an approach of using of direct negative feedback would be advantageous, it will be difficult to maintain stability when using the generic topologies of FIGS. 5A and 5B to feedback a portion of the PA output voltage. This is because the loop gain to a large extent becomes dependent on the load impedance. With a varying load impedance, the phase shift in the loop can therefore become larger than 180 degrees, with positive feedback and oscillation as a result.

FIG. 6 illustrates a generic transconductance amplifier system 70 configured to linearize a PA 72 in a manner which avoids stability issues due to varying load impedance. As shown, the output current from the PA 72 is dependent on the input voltage and the feedback resistor R1 rather than on the load impedance. However, this approach reduces overall gain due to the presence of the feedback resistor R1. Furthermore, the CG-stage in the Cascode configuration will not be linearized.

SUMMARY

Disclosed herein are systems and methods for amplifier linearization using magnetically coupled feedback. Embodiments of the amplifier linearization systems and techniques described herein may be utilized in a linear power amplifier (PA), either as a stand-alone PA, a PA integrated in a front-end module (FEM), or as a PA integrated in an RF-ASIC.

In one aspect the disclosure relates to an amplifier circuit including an amplifier having an amplifier input and an amplifier output. The amplifier circuit includes a transformer having a primary winding in series with the amplifier output and a secondary winding coupled to the amplifier input. The primary winding and the secondary winding are arranged such that a portion of a magnetic field generated by the primary winding couples to the secondary winding through a magnetically coupled feedback loop, thereby providing feedback from the amplifier output to the amplifier input. An output load arrangement is connected to the primary winding wherein the output arrangement includes a balun. The amplifier circuit may be implemented as an integrated circuit and where the primary and secondary windings are integrated in different metal layers of the integrated circuit or are otherwise arranged to effect a desired degree of magnetic coupling and feedback from the amplifier output to the amplifier input.

The disclosure is also directed to an amplifier circuit including an amplifier having an amplifier input and an amplifier output. A transformer disposed to provide a signal for driving a load includes a primary winding in series with the amplifier output. A secondary winding of the transformer is coupled to the amplifier input where the primary winding and the secondary winding are arranged such that a portion of a magnetic field generated by the primary winding couples to the secondary winding so as to establish a magnetically coupled feedback loop from the amplifier output to the amplifier input. A loop gain of the magnetically coupled feedback loop is substantially independent of an impedance of the load and is defined at least in part by a coupling factor and turn-ratio of the transformer. The load may be included within an output load arrangement including a balun.

In another aspect the disclosure pertains to an amplifier circuit including a first amplifier having a first amplifier input and a first amplifier output. A transformer includes a first transformer component having a first primary winding in series with the first amplifier output and a first secondary winding coupled to the first amplifier input. The first primary winding and the first secondary winding are arranged such that a portion of a first magnetic field generated by the first primary winding couples to the first secondary winding through a first magnetically coupled feedback loop, thereby providing first feedback from the first amplifier output to the first amplifier input. The amplifier circuit includes a second amplifier having a second amplifier input and a second amplifier output. The transformer further includes a second transformer component having a second primary winding in series with the second amplifier output and a second secondary winding coupled to the second amplifier input, where the first primary winding and the second primary winding are configured to drive a load. The second primary winding and the second secondary winding are arranged such that a portion of a second magnetic field generated by the second primary winding couples to the second secondary winding through a second magnetically coupled feedback loop, thereby providing second feedback from the second amplifier output to the second amplifier input.

The disclosure is further directed to a stacked amplifier circuit including an input stage having first and second input ports respectively defined by inputs of first and second transistors. The amplifier circuit includes a transformer arrangement configured to provide a signal for driving a load. The transformer arrangement has first and second primary windings and first and second secondary windings where a first end of the first secondary winding is connected to an output of the first transistor of the input stage and a first end of the second secondary winding is connected to an output of the second transistor of the input stage. The first primary winding and the first secondary winding are arranged such that a portion of a first magnetic field generated by the first primary winding couples to the first secondary winding. The second primary winding and the second secondary winding are arranged such that a portion of a second magnetic field generated by the second primary winding couples to the second secondary winding. An output stage has a differential input which is AC coupled to the first and second secondary windings and has an output connected to the first and second primary windings. The input stage and the output stage are arranged in a stacked configuration such that a bias current of the output stage is reused as bias current for the input stage.

In a particular aspect the disclosure relates to a method of operating an amplifier circuit having a transformer arranged so as to establish a magnetically coupled feedback loop between and output of an amplifier and an input of the amplifier. The method includes providing a DC bias current to the amplifier, and further includes increasing the DC bias current to improve a linearity of the amplifier circuit wherein a transfer gain of the amplifier circuit remains constant when the DC bias current is increased.

In yet another aspect the disclosure concerns a method of configuring an amplifier circuit having a transformer arranged so as to establish a magnetically coupled feedback loop between and output of an amplifier and an input of the amplifier. The method includes setting a loop gain of the magnetically coupled feedback loop by selecting a coupling factor and turn-ratio of the transformer.

BRIEF DESCRIPTION OF THE DRAWINGS

The features, nature and advantages of the present disclosure will become more apparent from the detailed description set forth below when taken in conjunction with the drawings in which like reference characters identify correspondingly throughout and wherein.

DETAILED DESCRIPTION

Figure 1:
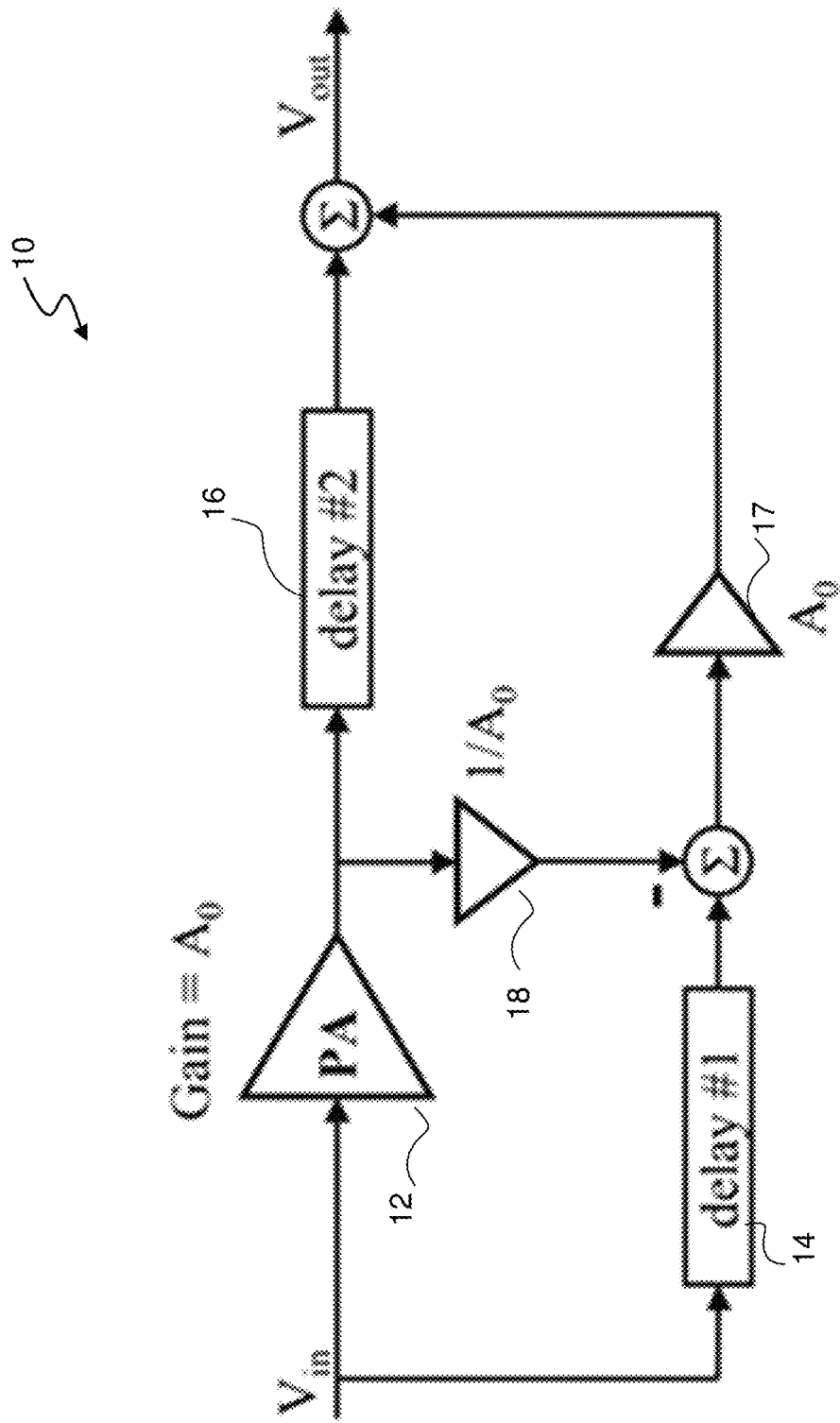
FIG. 1 depicts a block diagram of a conventional feedforward error correction system which may be used to linearize a PA.
Figure 2:
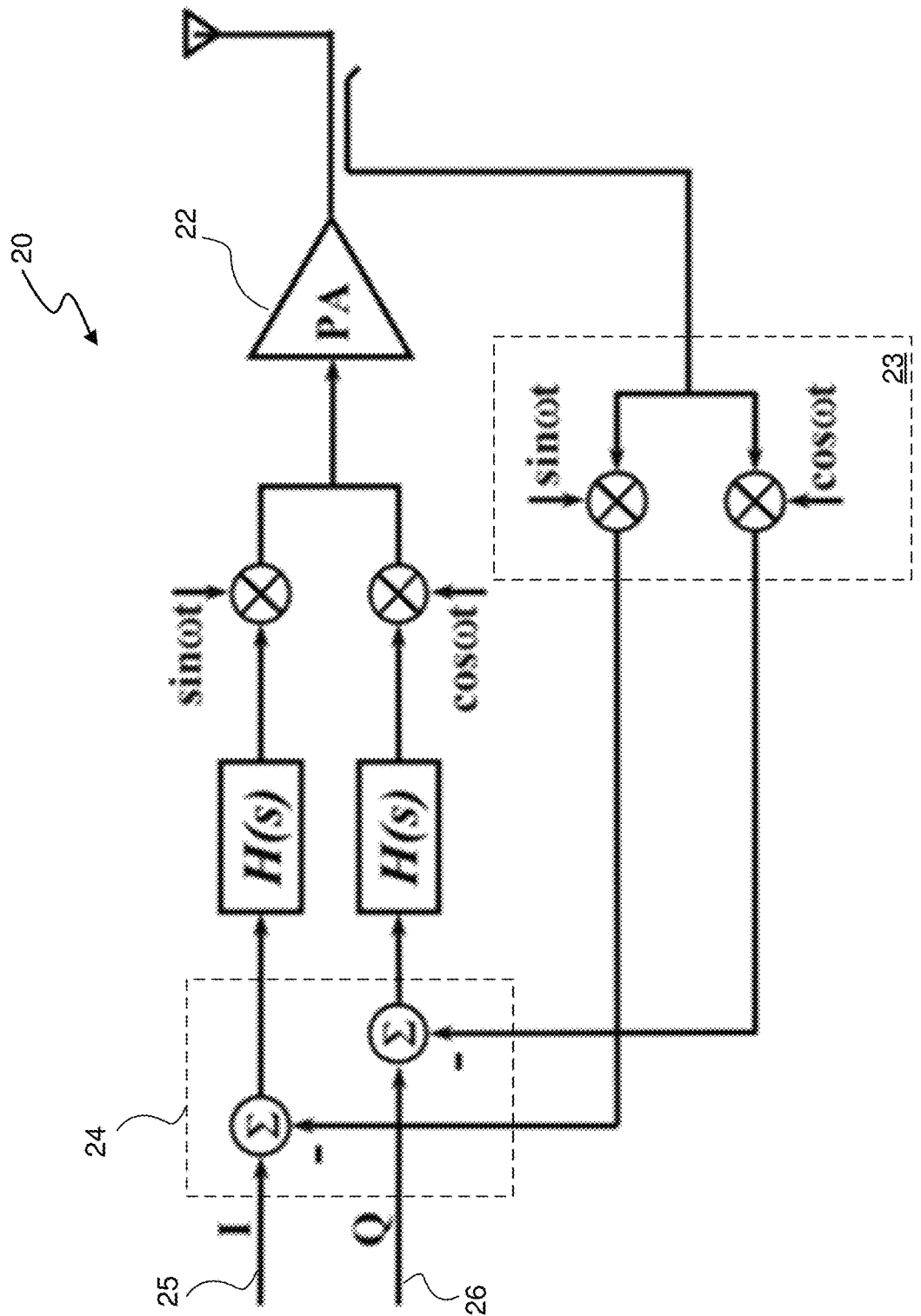
FIG. 2 depicts a block diagram of a so called Cartesian feedback system for amplifier linearization.
Figure 3:
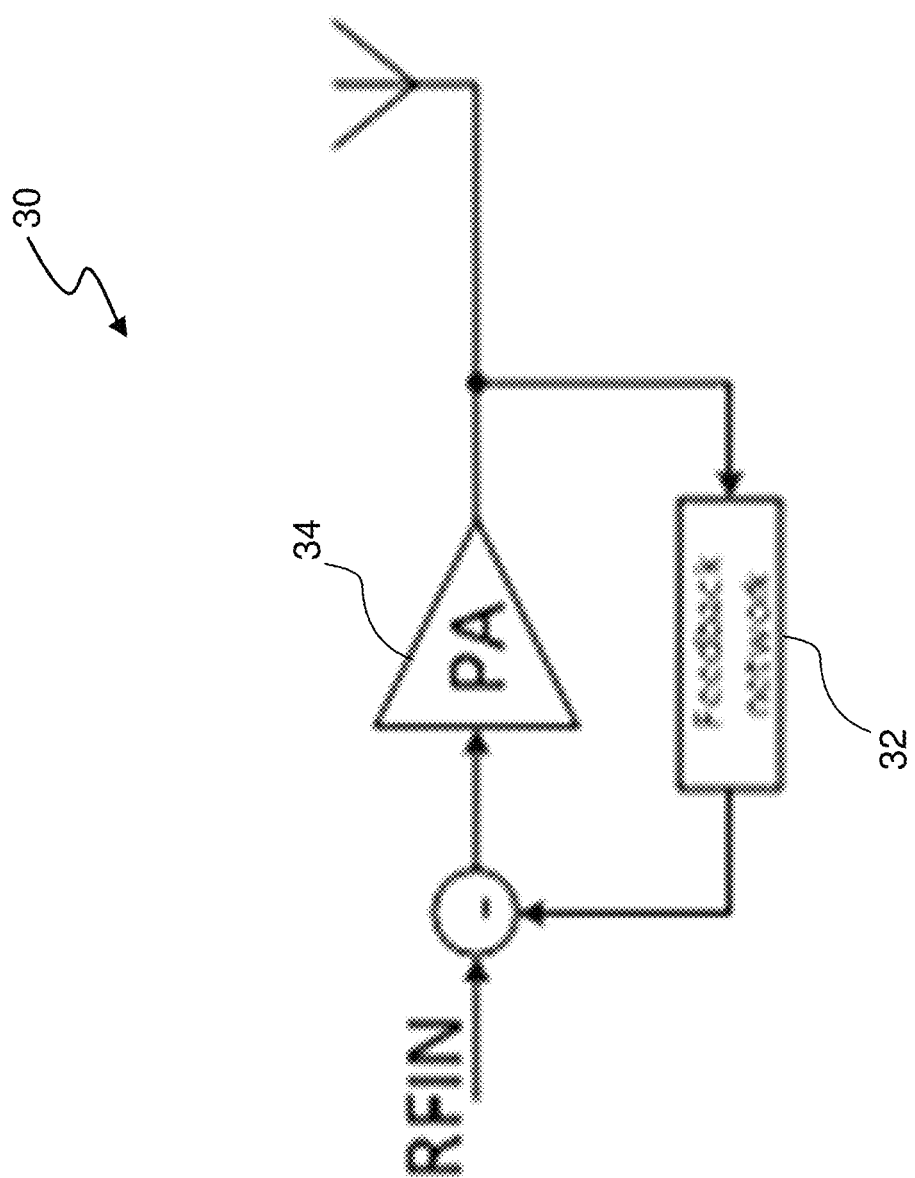
FIG. 3 depicts a diagram of a linear feedback system for amplifier linearization.
Figure 4:
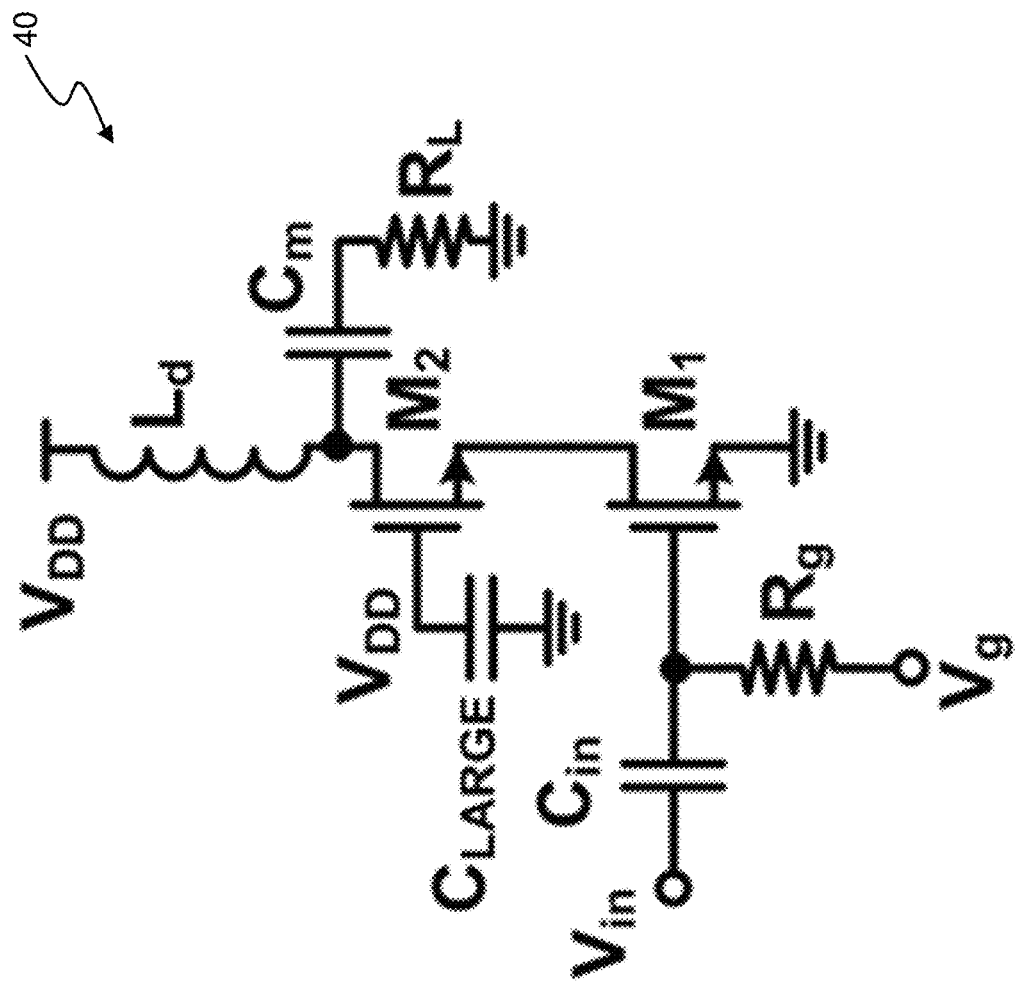
FIG. 4 illustrates a typical CMOS-based PA implementation.
Figure 5B:
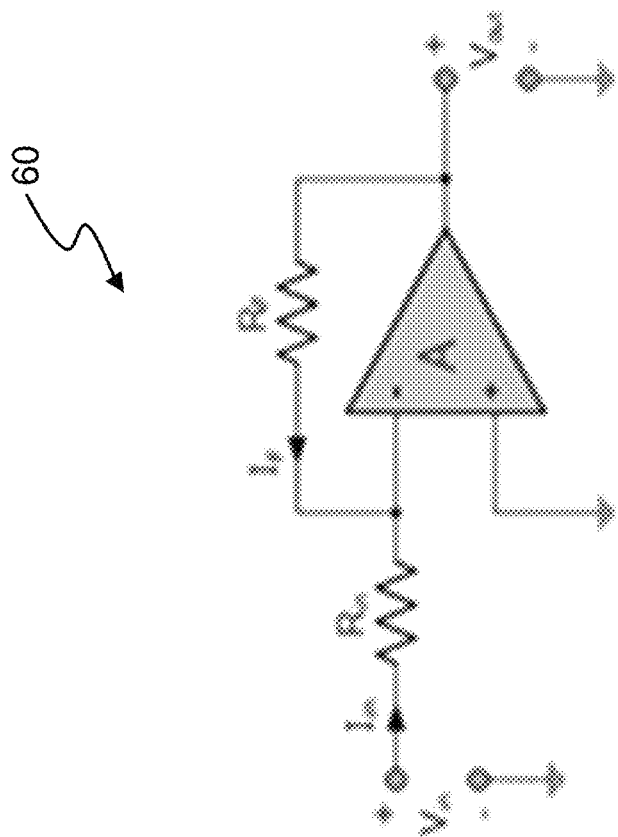
FIGS. 5A and 5B illustrate generic voltage amplifier circuit implementations of the direct negative feedback approach to linearization shown in FIG. 3.
Figure 5A:
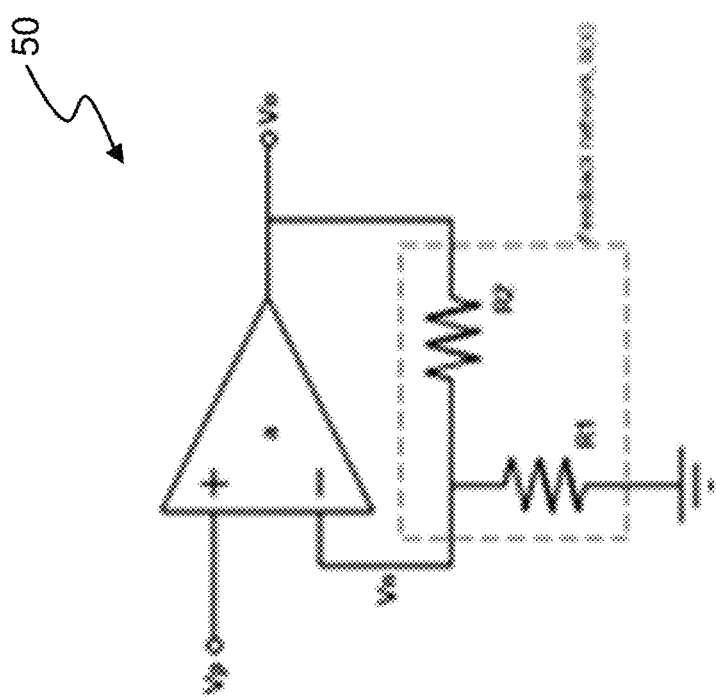
Figure 6:
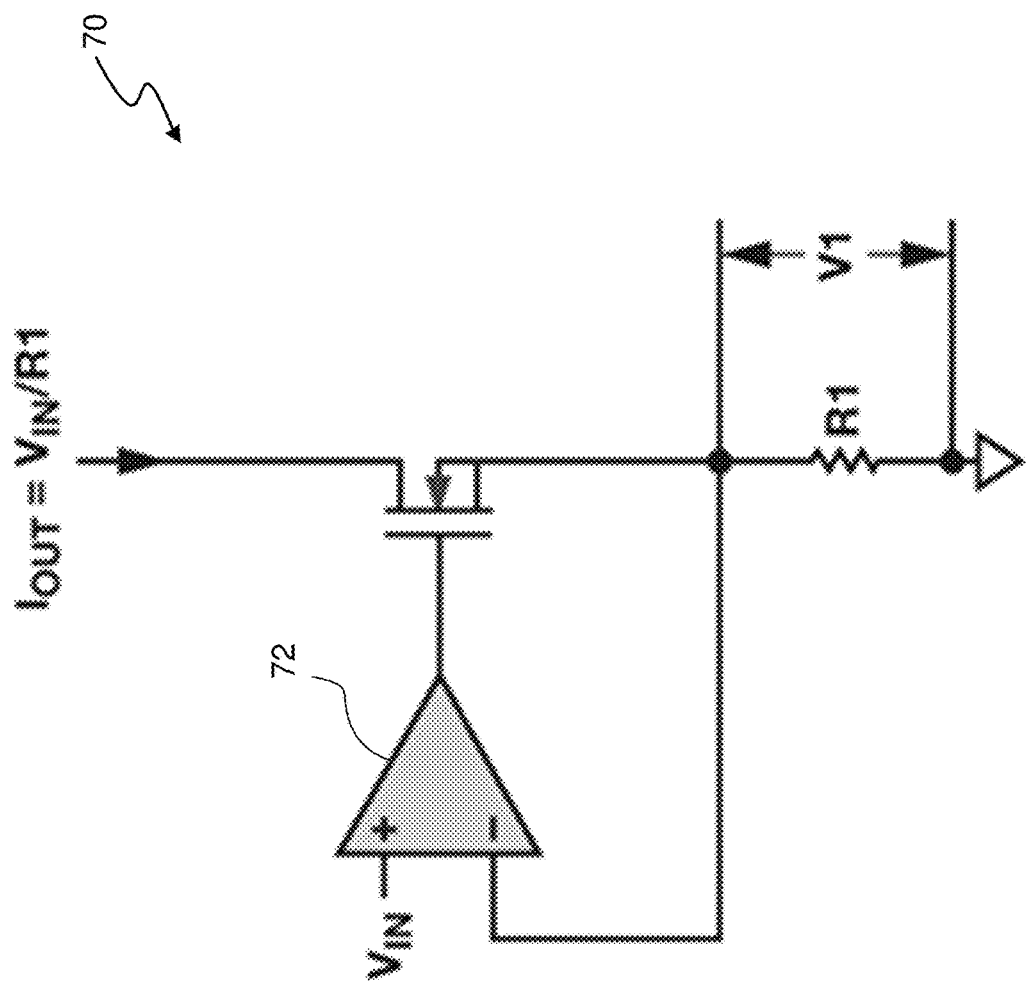
FIG. 6 illustrates a generic transconductance amplifier system configured to linearize a PA in a manner which avoids stability issues due to varying load impedance.
Figure 7:
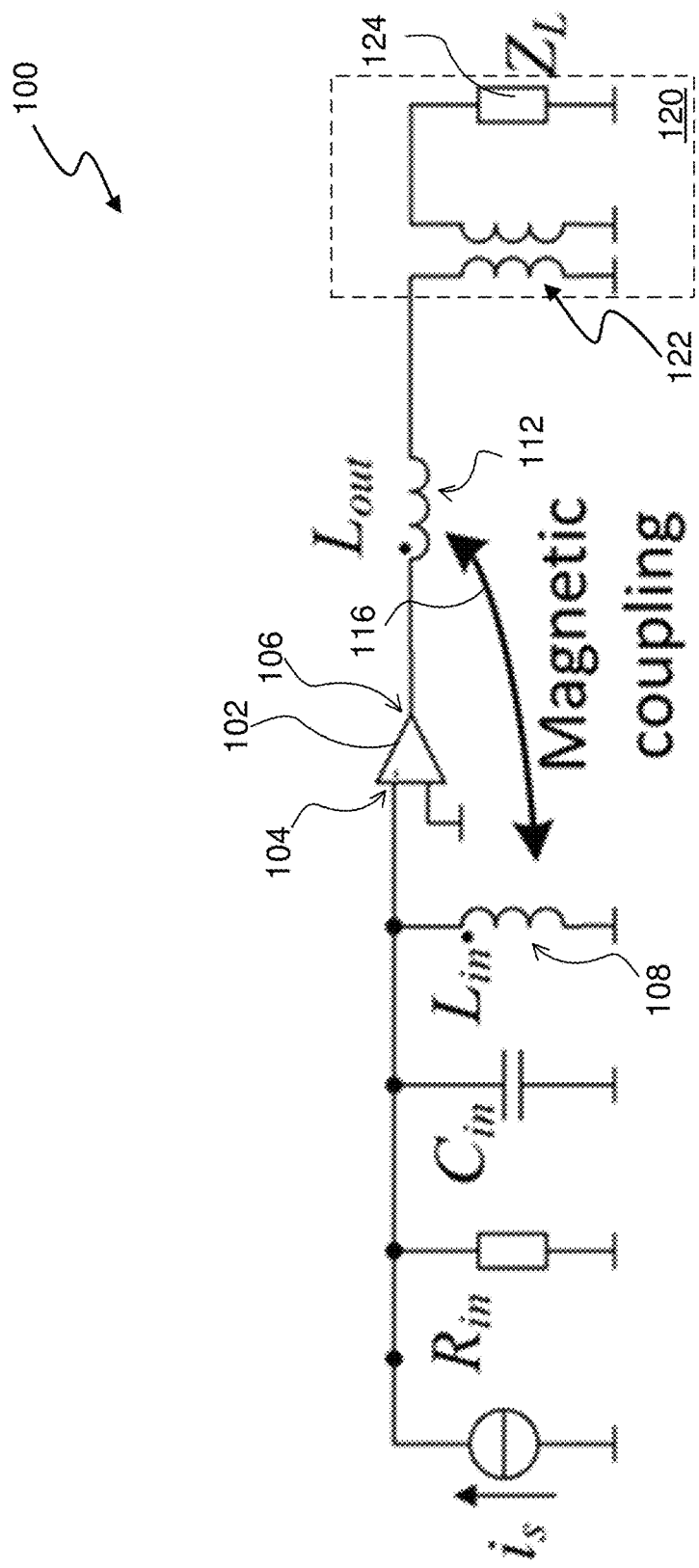
FIG. 7 illustrates a functional diagram of an embodiment of an amplifier linearization system using magnetically coupled feedback in accordance with the disclosure.

Attention is now directed to FIG. 7, which illustrates a functional diagram of an embodiment of an amplifier linearization system 100 using magnetically coupled feedback in accordance with the disclosure. The system 100 comprises a PA 102 having an input 104 and an output 106. A shunt inductance ($L_{in}$) 108 is placed at the input 104 of the amplifier to create a parallel resonance with an input capacitance ($C_{in}$) of the amplifier 102. In the embodiment of FIG. 7 this parallel resonance is represented by $R_{in}$, $L_{in}$ and $C_{in}$, where $R_{in}$ represent the losses of the parallel resonance circuit. The input from the previous stage driving the amplifier linearization system 100 is typically a current $i_s$ which generates an input voltage to the amplifier 102. An inductor 112 ($L_{out}$) is in series with the output 106 of the amplifier 102 and laid out or otherwise arranged in such a way that some of the magnetic field which it generates couples to the inductor 108. When arranged in this way the inductor 112 forms the primary winding of a transformer which includes a secondary winding comprised of the inductor 108.

During operation of the system 100 the magnetic field generated by the transformer primary winding (inductor 112) couples to the secondary winding (shunt inductance 108) through a magnetically coupled feedback loop 116, thereby providing feedback from the amplifier output 106 to the amplifier input 104. The amplifier 102 generates an output signal to an output load arrangement 120 connected to the transformer primary winding (inductor 112). In one embodiment the output load arrangement includes a balun 122 operative to convert a differential signal into a single-ended signal driving an external load impedance $Z_L$ 124.

Implementations of the amplifier system 100 are suitable for chip level integration where the two inductors $L_{in}$ and $L_{out}$ are preferably drawn in different metal layers and laid out on top of each other. This magnetic coupling from the output 106 to the input 104 of the power amplifier 102 generates direct feedback which is not believed to be present in state-of-the-art power amplifiers.

The amplifier system 100 can be implemented using either a single ended or differential amplifier configuration. In general it will be important to ensure that the parasitic capacitance between the amplifier output 106 and ground is small, else an excessive phase shift of up to 180 degrees will result and cause instability. Small parasitic capacitance at the amplifier output 106 is possible when integrating the power amplifier 102 on silicon, especially when a so called SOI (Silicon-On-Isolator) technology is used, where the parasitic device capacitances are extremely small.

Figure 8:
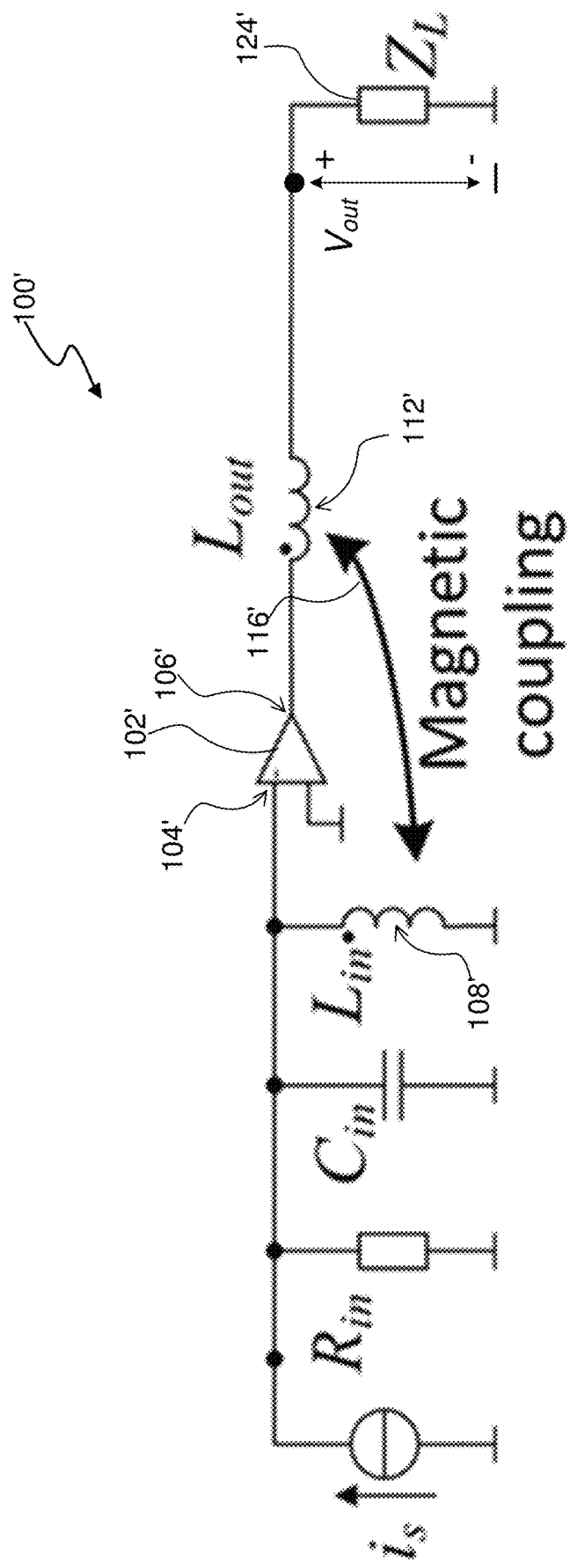
FIG. 8 illustrates a functional diagram of an amplifier linearization system which uses magnetically coupled feedback and lacks a balun at its output.

Turning now to FIG. 8, there is illustrated which a functional diagram of an amplifier linearization system 100' using magnetically coupled feedback in accordance with the disclosure. As shown, the linearization system 100' of FIG. 8 is substantially similar to the linearization system 100 of FIG. 7 with the exception that the linearization system 100' is configured with an output load arrangement comprised solely of an external load impedance $Z_L$ 124'; that is, the output load arrangement of the system 100' lacks a balun. In this case the output signal produced by the system 100' consists of the output voltage $V_{out}$ across the external load impedance $Z_L$ 124'.

CMOS-Based Implementation of Amplifier Linearization System

Figure 9:
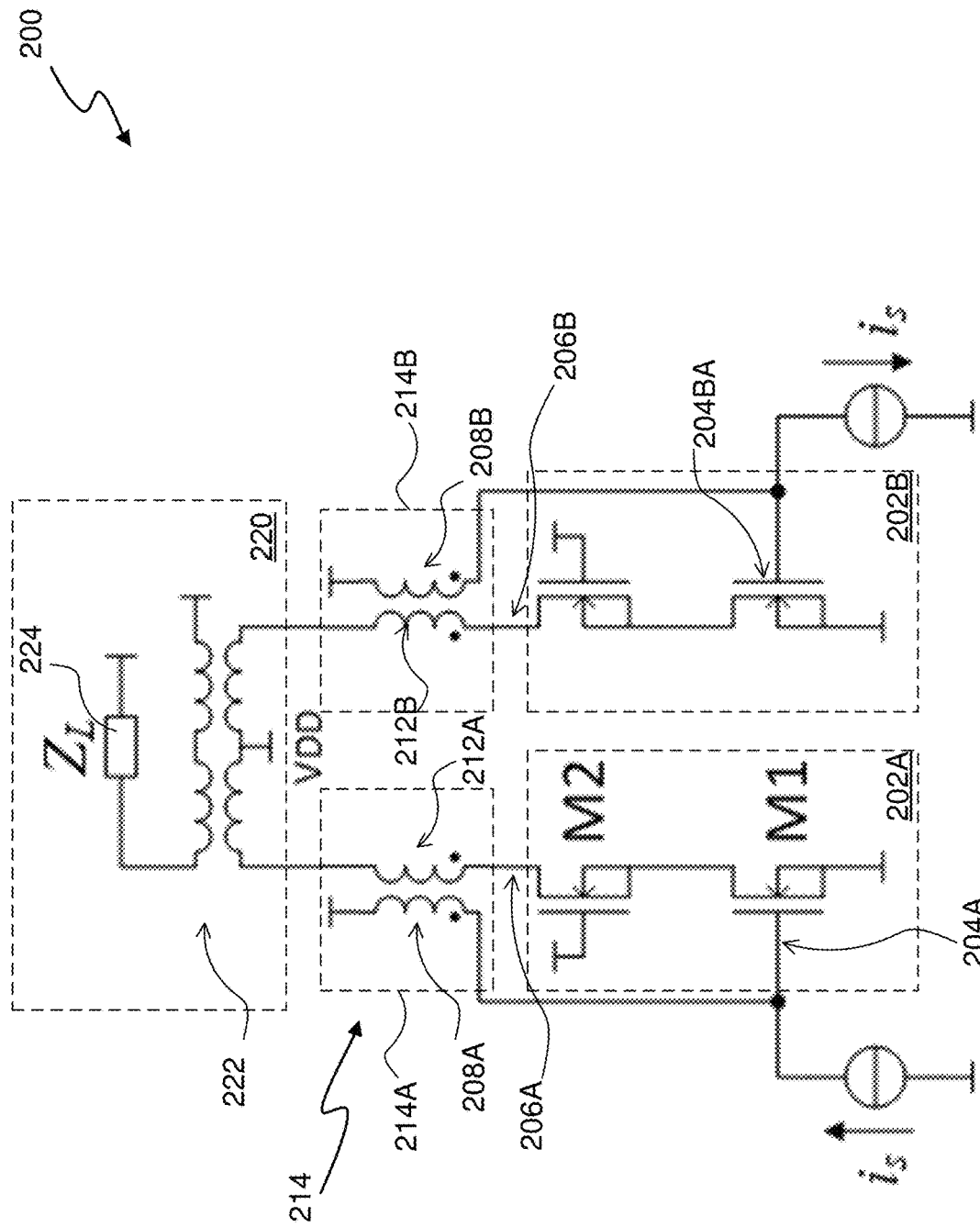
FIG. 9 is a circuit-level representation of CMOS-based implementation of an amplifier linearization system using magnetically coupled feedback in accordance with the disclosure.

Reference is now made to FIG. 9, which is a circuit-level representation of CMOS-based implementation of an amplifier linearization system 200 using magnetically coupled feedback in accordance with the disclosure. In the CMOS-based system 200 the power amplifier 202 is implemented with a Cascode stage (transistors M1 and M2). In the embodiment of FIG. 9 the input signal is differential and represented by the current source $i_s$. A transformer 214 having a primary winding 212 and a secondary winding 208 functions as a magnetically coupled feedback loop to effect feedback from an output 206 to an input 204 of amplifier 202. In one embodiment the transformer 214 is comprised of a first transformer component 214A and a second transformer component 214B, which may or may not be intertwined. The first transformer component 214A includes a primary winding 212A and a secondary winding 208A and the second transformer component 214B includes a primary winding 212B and a secondary winding 208B. An output load arrangement 220 includes a balun 222 connected to the primary winding 212A, 212B of the transformer components 214A, 214B. The balun 222 converts the output current provided by the primary transformer windings 212A, 212B into a single ended current, which generates power upon reaching an external load impedance 224 included within the output load arrangement 220.

Mathematical Characterization of Amplifier Linearization System

Figure 10A:
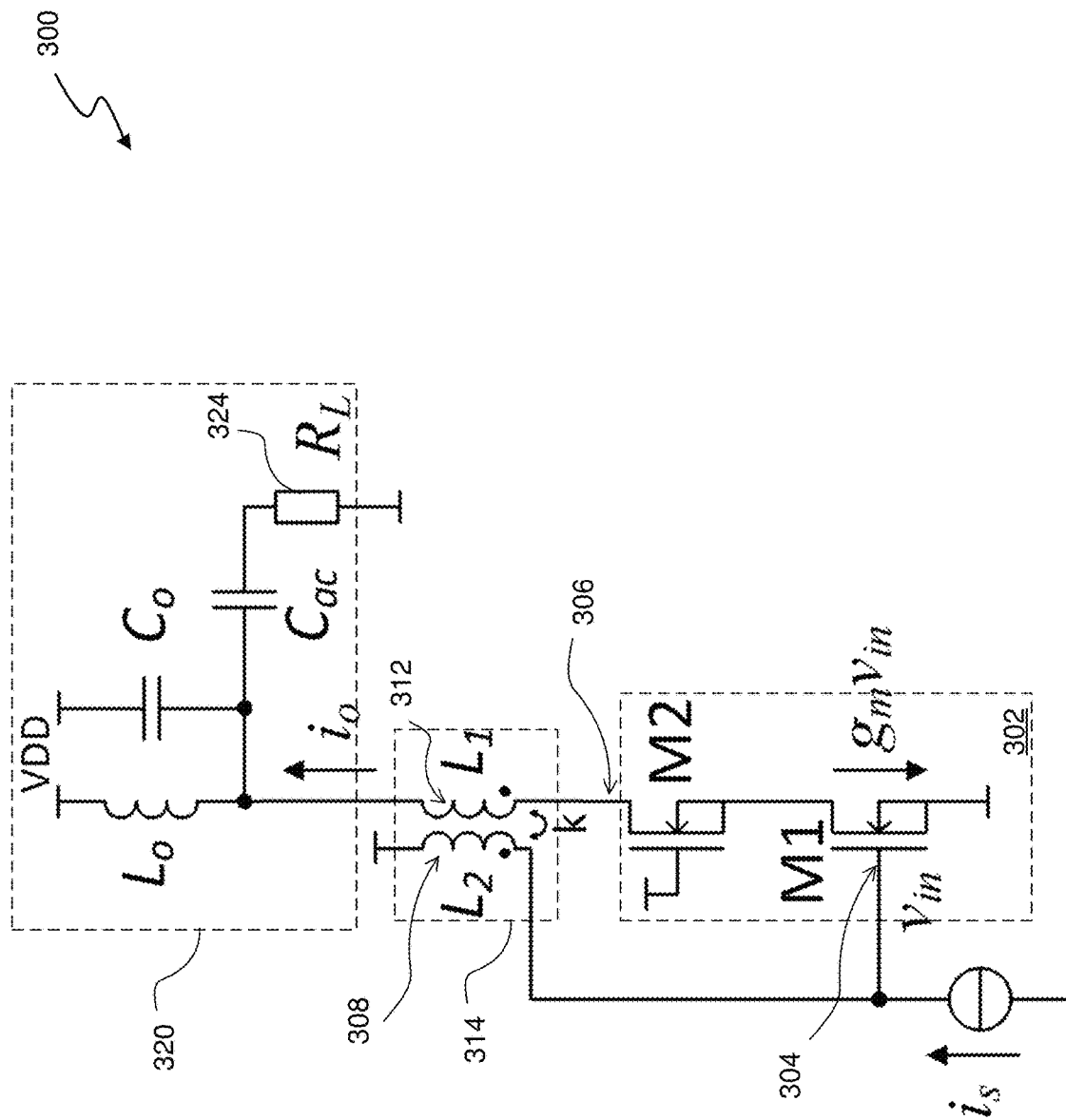
FIGS. 10A and 10B are circuit-level illustrations of a single-ended version of a CMOS-based implementation of an amplifier linearization system using magnetically coupled feedback.
Figure 10B:
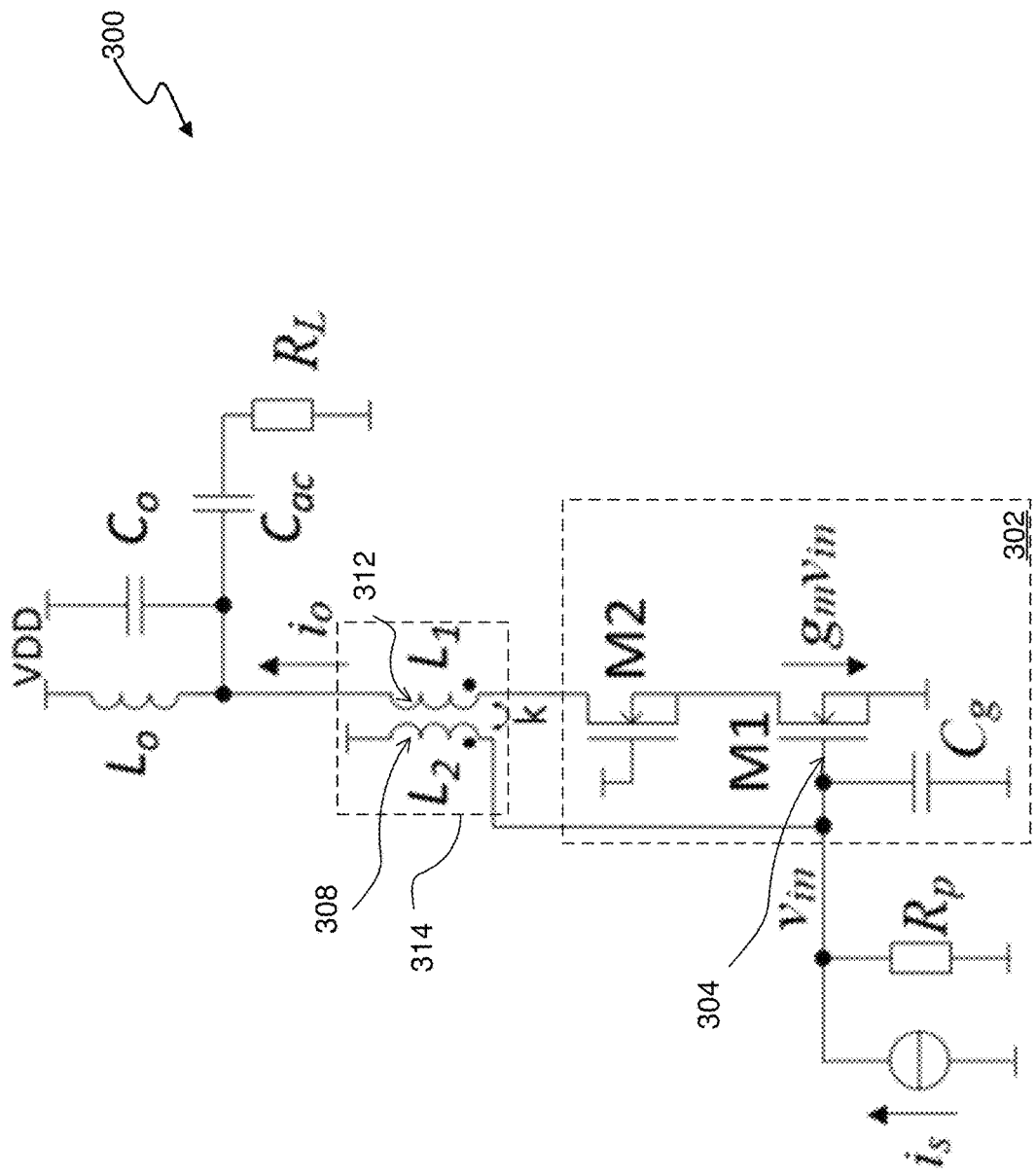

Attention is now directed to FIGS. 10A and 10B, which illustrate a single-ended version of a CMOS-based implementation of an amplifier linearization system 300 using magnetically coupled feedback. FIG. 10A depicts components present in an exemplary physical realization of the system 300 while FIG. 10B further illustrates additional components to which reference will be made in the mathematical characterization of the system 300 set forth below. With reference to FIG. 10B, the input signal is, as in the differential case of FIG. 9, represented by the current source $i_s$. The capacitance $C_g$ is the total parasitic capacitance from the input node 304 of the amplifier 302 to ground, which is dominated by the gate capacitance of M1. The inductance $L_2$ of the secondary winding 308 of the transformer 314 should in combination with the capacitance $C_g$ be selected such that resonance occurs at the frequency of operation according to Equation 1.

$$f_0 = \frac{1}{2\pi\sqrt{L_2 C_g}}$$ Equation 1

The resistance $R_p$ (FIG. 10B) is not a physical resistance, instead it is a model of the losses from the resonance circuit at the input of the amplifier 302, which is primarily determined by the losses of the inductance $L_2$ of the secondary winding 308 of the transformer 314 according Equation 2, where $QL_2$ is the quality factor of $L_2$.

$$R_p = Q_{L2} 2\pi f L_2$$ Equation 2:

The device M1 converts the voltage at its gate ($v_{in}$) into a current with the transconductance ($g_m$) of M1. The inductance of the primary winding 312 of the transformer 314 is $L_1$ and the so called turn-ratio of the transformer is defined by Equation 3.

$$n = \sqrt{\frac{L_2}{L_1}}$$ Equation 3

The transformer 314 may also be characterized by its so-called coupling factor k, which is a measure of the amount of inductive coupling that exists between the two coils 308, 312 and is expressed as a fractional number between 0 and 1, where 0 indicates zero or no inductive coupling, and 1 indicating full or maximum inductive coupling.

The load inductance $L_o$ and capacitance $C_o$ are chosen such that resonance occurs at the frequency of operation according Equation 4. The AC coupling capacitance Cagy is selected such that its impedance is low compared to the load impedance $R_L$. Hence, the load seen by the output current $i_o$ can, at the frequency of operation, be represented by the load impedance $R_L$.

$$f_0 = \frac{1}{2\pi\sqrt{L_o C_o}}$$ Equation 4

With the definitions made above, it is possible to calculate the current gain, which results in Equation 5.

$$A_i = \frac{i_o}{i_s} = A_{i\infty} \frac{A\beta}{1 - A\beta}$$ Equation 5

Where $A\beta$ is the loopgain of the feedback loop as defined in Equation 6 and $A_{i\infty}$ is the current gain with infinite loop gain as defined in Equation 7.

$$A\beta = -g_m R_p \frac{k}{n}$$ Equation 6

$$A_{i\infty} = \frac{n}{k}$$ Equation 7

As may be appreciated from Equation 7, when the loop gain $A\beta$ is is infinite the gain of the amplifier system 300 depends only on the characteristics of the transformer 314 as expressed by $A_{i\infty}$. This means that under these conditions the gain is substantially independent of the inherent gain characteristics of the amplifier 302, i.e. it is substantially independent of $g_m$. This brings significant advantages as $g_m$ is to large extent dependent on temperature, bias current, silicon technology behavior, loading effects, and supply voltage variations. In practice, it is of course not possible to realize an infinite loop gain. However, the inventor has found that when the loop gain is on the order of 10 dB the amplifier system 300 generally exhibits the desired behavior.

Key Features of Amplifier Linearization System

From the above equations various features and advantages of the present amplifier linearization system are apparent. First, one key advantage of the present system is that the load impedance is not found in any of the preceding expressions. Hence, stability is much easier to accomplish in the present system relative to conventional power amplifier systems since the loop gain is independent on the load impedance; that is, any variation of the load impedance in the present system will not impact loop stability. Second, another important aspect of the present system is that the gain is defined by the coupling factor and the turn-ratio of the transformer, which are constant across both temperature and signal level variations. In a Cascode amplifier without this feedback, the gain is achieved by converting the input voltage of the Cascode into current by the transconductance of the Common Source stage of the Cascode, which is both temperature as well as signal level dependent. A gain which is dependent on the signal level results in distortion, which is typically solved by backing off the signal level from the compression point of the amplifier. However, the presently disclosed feedback topology enables an amplifier to operate closer to compression without degrading its linearity performance. Yet another key advantage of the present system is that its input impedance is low due to the magnetically coupled feedback, which results in a lower voltage swing at the input of the Cascode. Since the input current is generated by a driver stage, low voltage swing at the driver output reduces its distortion and makes the overall system more linear.

Additional Novel Features and Advantages

As can be seen in FIGS. 9, 10A and 10B, assuming the presence of a shunt inductance at the input of the amplifier 302 (FIGS. 10A, 10B), the magnetically coupled feedback network does not require any additional circuitry other than the series inductance 312 located at the output of the amplifier 302. Furthermore, no additional DC current is required to bias the magnetically coupled feedback network.

From Equation 6, it can be seen that the loop gain is proportional to the transconductance of the Common Source stage, which offers important advantages. For example, since $g_m$ is dependent on the current flowing in the Common Source stage, the loop gain will increase when the signal is increased, i.e., the loop gain will become large when the signal level is large. This is a preferred characteristic from a linearity point of view.

It is known that state-of-the-art power amplifiers often operate in so called class AB operation, which means that DC power dissipation increases with the signal level. Due to the magnetically coupled feedback topology described herein, the amplifier can be biased in class A operation, which means that the DC power dissipation remains constant independent on the signal level. In many applications this is a very important feature. One such application is in WiFi power amplifiers, where a high output power is typically transmitted when the link is established. In accordance with the present disclosure, a high output power can be transmitted without increasing the power dissipation.

It is also observed that the signal transfer function of the present linearized power amplifier system is defined by passive layout structures (i.e., one or more transformers) which are independent of signal level and temperature. This feature can be used to program the power amplifier system for different use cases. For example, when very good linearity is required the DC bias current can be increased to provide improved linearity without impacting the transfer gain of the amplifier system. In contrast, changing the bias conditions of state-of-the-art amplifiers will also impact the gain of such amplifiers.

It is further observed that the load impedance has little or no direct impact on loop stability. In addition, the input impedance of the output stage is low, which reduces the voltage swing at the input. Finally, the disclosed feedback concept is suitable for chip-integration, both in CMOS and Bipolar technologies.

Stacked Input and Output Stages

Figure 11:
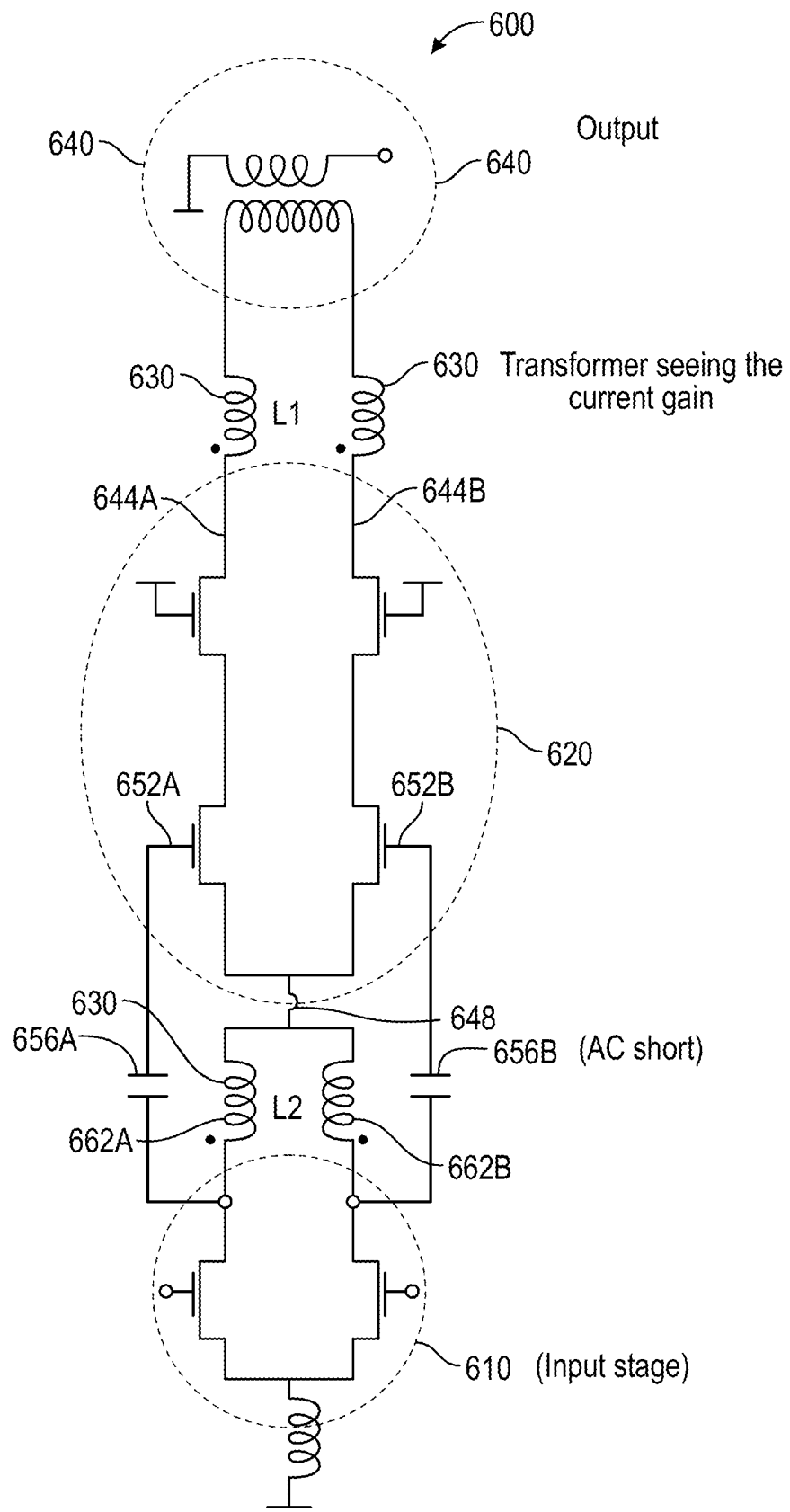
FIG. 11 illustrates an implementation of a linearized power amplifier having stacked input and output stages.

Turning now to FIG. 11, an implementation is shown of a linearized power amplifier system 600 having an input stage 610, an output stage 620, a transformer arrangement 630 and an output balun 640. The input stage 610 and the output stage 620 are realized in different integrated circuit layers and are laid out so as to be stacked on each other. The transformer arrangement 630 effects magnetically coupled feedback from first and second outputs 644A, 644B of the output stage 620 to an input 648 of the output stage 620. As shown, the output stage 620 has a differential input 652A, 652B which is AC coupled 656A, 656B to first and second secondary windings 662A, 662B of the transformer arrangement 630. One key advantage of this stacked configuration is that the bias current of the output stage 620 is reused as bias current for the input stage 610, which improves efficiency of the power amplifier system 600.

Where methods described above indicate certain events occurring in certain order, the ordering of certain events may be modified. Additionally, certain of the events may be performed concurrently in a parallel process when possible, as well as performed sequentially as described above. Accordingly, the specification is intended to embrace all such modifications and variations of the disclosed embodiments that fall within the spirit and scope of the appended claims.

The foregoing description, for purposes of explanation, used specific nomenclature to provide a thorough understanding of the claimed systems and methods. However, it will be apparent to one skilled in the art that specific details are not required in order to practice the systems and methods described herein. Thus, the foregoing descriptions of specific embodiments of the described systems and methods are presented for purposes of illustration and description. They are not intended to be exhaustive or to limit the claims to the precise forms disclosed; obviously, many modifications and variations are possible in view of the above teachings. The embodiments were chosen and described in order to best explain the principles of the described systems and methods and their practical applications, they thereby enable others skilled in the art to best utilize the described systems and methods and various embodiments with various modifications as are suited to the particular use contemplated. It is intended that the following claims and their equivalents define the scope of the systems and methods described herein.

Also, various inventive concepts may be embodied as one or more methods, of which an example has been provided.

The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An amplifier circuit, comprising:
an amplifier having an amplifier input and an amplifier output;
a transformer having a primary winding in series with the amplifier output and a secondary winding coupled to the amplifier input wherein the primary winding and the secondary winding are arranged such that a portion of a magnetic field generated by the primary winding couples to the secondary winding so as to establish a magnetically coupled feedback loop from the amplifier output to the amplifier input, the transformer providing a current or voltage for driving a load included within an output load arrangement connected to the primary winding of the transformer;
wherein a loop gain of the magnetically coupled feedback loop is substantially independent of an impedance of the load and is defined at least in part by a coupling factor and turn-ratio of the transformer;
wherein an inductance ($L_2$) of the secondary winding is selected in conjunction with a parasitic capacitance ($C_g$) between the amplifier input and ground such that resonance of the amplifier circuit occurs at a resonant frequency ($f_0$) equivalent to a desired frequency of operation wherein $f_0$ is represented as:

$$f_0 = \frac{1}{2\pi\sqrt{L_2 C_g}}.$$

2. The amplifier circuit of claim 1 wherein the output load arrangement includes a balun connected to the primary winding and wherein the primary winding provides a first output current to the balun and the balun converts the first output current provided by the primary winding into a second output current.

3. The amplifier circuit of claim 1 wherein the amplifier circuit is implemented as an integrated circuit and wherein the output load arrangement includes an inductive element.

4. The amplifier circuit of claim 1 wherein the amplifier is implemented in a cascode configuration.

5. An amplifier circuit, comprising:
an amplifier having an amplifier input and an amplifier output;
a transformer having a primary winding in series with the amplifier output and a secondary winding coupled to the amplifier input wherein the primary winding and the secondary winding are arranged such that a portion of a magnetic field generated by the primary winding couples to the secondary winding so as to establish a magnetically coupled feedback loop from the amplifier output to the amplifier input, the transformer providing a signal current or voltage for driving a load included within an output load arrangement connected to the primary winding of the transformer;
wherein a loop gain of the magnetically coupled feedback loop is substantially independent of an impedance of the load and is defined at least in part by a coupling factor and turn-ratio of the transformer;
wherein the output load arrangement includes a balun connected to the primary winding and wherein the primary winding provides a first output current to the balun and the balun converts the first output current provided by the primary winding into a second output current;
wherein the amplifier circuit is characterized by a current gain $A_i$ of:

$$A_i = \frac{i_o}{i_s} = A_{i\infty}\frac{A\beta}{1 - A\beta}$$

where $t_s$ is the current provided to the amplifier input, $t_o$ is the current provided to the output load arrangement, and $A\beta$ is a loop gain defined by:

$$A\beta = -g_m R_p \frac{k}{n}$$

where here $g_m$ is the transconductance of the amplifier, k is a coupling factor between the primary winding and the secondary winding, $R_p$ is a resistance to ground at the amplifier input, where $A_{i\infty}$ is the current gain with infinite loop gain and is expressed as:

$$A_{i\infty} = \frac{n}{k}$$

where n is a turn-ratio of the transformer, which can be expressed as:

$$n = \sqrt{\frac{L_2}{L_1}}$$

and where $L_1$ is an inductance of the primary winding and $L_2$ is an inductance of the secondary winding.

6. The amplifier circuit of claim 1 further including a balun included within the output load arrangement, the balun being connected between the primary winding and the load.

7. The amplifier circuit of claim 6 wherein the primary winding has a first end connected to the amplifier output and a second end connected to a first end of the balun.

8. The amplifier circuit of claim 1 wherein the amplifier circuit is implemented as an integrated circuit.

9. An amplifier circuit, comprising:
an amplifier having an amplifier input and an amplifier output;
a transformer configured to provide feedback from the amplifier output to the amplifier input over a magnetically coupled feedback loop, the transformer having a primary winding connected to the amplifier output and a secondary winding coupled to the amplifier input;
wherein the transformer provides a current or voltage for driving a load included within an output load arrangement connected to the transformer and wherein a loop gain of the magnetically coupled feedback loop is independent of an impedance of the load and is defined at least in part by a coupling factor and turn-ratio of the transformer;

wherein an inductance ($L_2$) of the secondary winding is selected in conjunction with a parasitic capacitance ($C_g$) between the amplifier input and ground such that resonance of the amplifier circuit occurs at a resonant frequency ($f_0$) equivalent to a desired frequency of operation wherein $f_0$ is represented as:

$$f_0 = \frac{1}{2\pi\sqrt{L_2 C_g}}.$$

10. The amplifier circuit of claim 9 further including a balun included within the output load arrangement, the balun being connected between the transformer and the load.

11. The amplifier circuit of claim 9 wherein the transformer includes a first inductor connected in series to the amplifier output and a second inductor connected in shunt to the amplifier input.

12. The amplifier circuit of claim 9 wherein the loop gain of the magnetically coupled feedback loop automatically increases in response to corresponding increases in a level of an input signal applied to the amplifier input so as to maintain a substantially constant level of an output signal produced at the amplifier output.

13. The amplifier circuit of claim 9 wherein power dissipation of the amplifier remains substantially constant independent of characteristics of an input signal applied to the amplifier input.

14. The amplifier circuit of claim 9 wherein a current gain of the amplifier circuit is substantially independent of gain characteristics of the amplifier when the transformer is configured such that a loop gain of the magnetically coupled feedback loop is greater than 10 dB.

15. The amplifier circuit of claim 1 wherein the loop gain of the magnetically coupled feedback loop automatically increases in response to corresponding increases in a level of an input signal applied to the amplifier input so as to maintain a substantially constant level of an output signal produced at the amplifier output.

16. The amplifier circuit of claim 1 wherein power dissipation of the amplifier remains substantially constant independent of characteristics of an input signal applied to the amplifier input.

17. The amplifier circuit of claim 1 wherein a current gain of the amplifier circuit is substantially independent of gain characteristics of the amplifier when the transformer is configured such that the loop gain of the magnetically coupled feedback loop is greater than 10 dB.

18. The amplifier circuit of claim 13 wherein the characteristics include at least one of amplitude and power.

19. The amplifier circuit of claim 13 wherein the characteristics include at least one of modulation type and bandwidth.

20. The amplifier circuit of claim 16 wherein the characteristics include at least one of amplitude and power.

21. The amplifier circuit of claim 16 wherein the characteristics include at least one of modulation type and bandwidth.

22. The amplifier circuit of claim 1 wherein power dissipation of the amplifier remains substantially constant independent of a level of an output signal produced at the amplifier output.

23. The amplifier circuit of claim 9 wherein power dissipation of the amplifier remains substantially constant independent of a level of an output signal produced at the amplifier output.

24. The amplifier circuit of claim 1 wherein current gain of the amplifier circuit is defined by a turn-ratio and a coupling factor of the transformer.

* * * * *